(12) United States Patent
Laforge et al.

(10) Patent No.: US 11,499,242 B2
(45) Date of Patent: Nov. 15, 2022

(54) METHOD FOR PRODUCING A METAL DECORATION ON A DIAL AND DIAL OBTAINED ACCORDING TO THIS METHOD

(71) Applicant: The Swatch Group Research and Development Ltd, Marin (CH)

(72) Inventors: Elias Laforge, Neuchatel (CH); Simon Springer, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 17/052,376

(22) PCT Filed: May 23, 2019

(86) PCT No.: PCT/EP2019/063357
§ 371 (c)(1),
(2) Date: Nov. 2, 2020

(87) PCT Pub. No.: WO2019/228902
PCT Pub. Date: Dec. 5, 2019

(65) Prior Publication Data
US 2021/0054518 A1 Feb. 25, 2021

(30) Foreign Application Priority Data
May 28, 2018 (EP) .................................. 18174638

(51) Int. Cl.
*C25D 5/02* (2006.01)
*C25D 5/56* (2006.01)
(Continued)

(52) U.S. Cl.
CPC ................ *C25D 5/02* (2013.01); *C23C 16/06* (2013.01); *C23C 28/321* (2013.01);
(Continued)

(58) Field of Classification Search
CPC ...... C23C 28/02; C23C 28/021; C23C 14/042; C25D 5/02; C25D 5/56; C25D 7/005
(Continued)

(56) References Cited

U.S. PATENT DOCUMENTS

| 2006/0011471 A1* | 1/2006 | Grippo | .................... C04B 41/52 |
| | | | 204/192.15 |
| 2011/0020754 A1* | 1/2011 | Fiaccabrino | ........... C25D 5/022 |
| | | | 430/325 |

(Continued)

FOREIGN PATENT DOCUMENTS

| CH | 712 968 B1 | 3/2018 |
| EP | 2 048 265 A1 | 4/2009 |
| EP | 2 380 864 A1 | 10/2011 |

OTHER PUBLICATIONS

Meyer et al., "Simulation of a LIG(A) Production Line," Proceedings of the 4th Manufacturing Simulation, Palermo (Italy) [2006], pp. 442-445. (Year: 2006).*

(Continued)

*Primary Examiner* — Edna Wong
(74) *Attorney, Agent, or Firm* — Oblon, McClelland, Maier & Neustadt, L.L.P.

(57) ABSTRACT

A method for producing metal decorations on a curved dial made of insulating material includes forming, by a method of the LIGA-UV type, a mould made of photosensitive resin and of galvanically depositing a layer of at least one metal from the conductive layer in order to form a block substantially reaching the upper surface of the photosensitive resin.

10 Claims, 1 Drawing Sheet

Figure 1A:
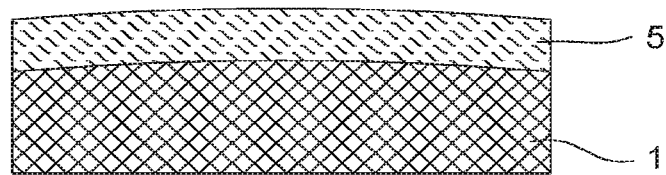

(51) Int. Cl.
*C23C 16/06* (2006.01)
*C23C 28/00* (2006.01)
*C25D 1/00* (2006.01)
*C25D 5/34* (2006.01)
*C25D 5/52* (2006.01)
*C25D 7/00* (2006.01)
*G03F 7/24* (2006.01)
*G03F 7/42* (2006.01)
*G04B 19/10* (2006.01)

(52) U.S. Cl.
CPC .......... *C23C 28/3225* (2013.01); *C23C 28/34* (2013.01); *C25D 1/003* (2013.01); *C25D 5/34* (2013.01); *C25D 5/52* (2013.01); *C25D 5/56* (2013.01); *C25D 7/005* (2013.01); *G03F 7/24* (2013.01); *G03F 7/42* (2013.01); *G04B 19/10* (2013.01)

(58) Field of Classification Search
USPC .................................................. 205/118, 120
See application file for complete search history.

(56) References Cited

U.S. PATENT DOCUMENTS

2011/0259753 A1* 10/2011 Grossenbacher ....... C04B 41/52
    205/162
2017/0298525 A1* 10/2017 Bourlier ................ C25D 7/126
2018/0204976 A1* 7/2018 Kim ................ H01L 31/035227
2019/0098946 A1* 4/2019 Bee ...................... A43B 13/122

OTHER PUBLICATIONS

Park et al., "Fabrication of Metallic Microstructure on Curved Substrate by Optical Soft Lithography and Copper Electroplating," Sensors and Actuators A: Physical (Jul. 1, 2011), vol. 168, No. 1, pp. 105-111. (Year: 2011).*
Park, J. et al., "Fabrication of metallic microstructure on curved substrate by optical soft lithography and copper electroplating," Sensors and Actuators A: Physical, vol. 168, 2011, XP055502651, pp. 105-111.
International Search Report dated Jun. 13, 2019 in PCT/EP2019/063357 filed on May 23, 2019, 4 pages.
European Search Report dated Nov. 21, 2018 in European Application No. 18 17 4638 filed on May 28, 2018, 1 page.

* cited by examiner

METHOD FOR PRODUCING A METAL DECORATION ON A DIAL AND DIAL OBTAINED ACCORDING TO THIS METHOD

CROSS-REFERENCE TO RELATED APPLICATIONS

The present application is a national stage entry of International Application No. PCT/EP2019/063357, filed May 23, 2019, which claims priority to European Patent Application No. 18174638.9, filed on May 28, 2018, the entire content and disclosure of which are incorporated by reference herein.

FIELD OF THE INVENTION

The present invention relates to a method for producing a metal decoration by a LIGA type technology. Particularly, the invention relates to such a method for producing a dial made of curved ceramic with a metal decoration optimally adapting on the dial. The invention also relates to such a dial obtained by this method.

BACKGROUND OF THE INVENTION

The LIGA (Lithographie Galvanik Abformung) technology developed by W. Ehrfeld from the Karlsruhe Nuclear Research Center, Germany) in the 1980s has proven interesting for the production of high-precision metal microstructures.

In its principle, the LIGA technique consists in depositing on a substrate that is conductive or coated with a conductive layer, a layer of a photosensitive resin, carrying out through a mask corresponding to the contour of the desired microstructure an X-ray by means of a synchrotron, developing, that is to say eliminating by physical or chemical means the portions of the photosensitive resin layer not irradiated in order to define a mould having the contour of the microstructure, galvanically depositing a metal, typically nickel, in the mould made of photosensitive resin, then eliminating the mould to release the microstructure.

The quality of the microstructures obtained is above criticism, but the need to implement expensive equipment (synchrotron) makes this technique not very compatible with a mass production of microstructures that must have a low unit cost.

This is why based on said LIGA method, similar methods have been developed but using resins that are photosensitive to UVs. Such a method is in particular described in document CH 704 955, and comprises the steps of:
  providing a substrate whereof at least one of the faces is conductive;
  applying on the conductive face of the substrate a photosensitive resin layer;
  irradiating the resin layer through a mask defining the contour of the desired microstructure;
  dissolving the non-irradiated areas of the photosensitive resin layer in order to show in places the conductive face of the substrate;
  alternately galvanically depositing layers of a first metal and of at least one second metal from said conductive face in order to form a block substantially reaching the upper surface of the photosensitive resin, said block being formed of a stack of layers of the first and second metals;
  separating by delamination the resin layer and the electrodeposited block from the substrate;
  eliminating the photosensitive resin layer of the delaminated structure in order to release the microstructure thus formed.

The production of metal decorations by galvanic deposition according to this method of the prior art is done on a flat surface and the implementation thereof on a part having curved surface is much more complex, the curvature of the part not making it possible to correctly mount the decorations.

SUMMARY OF THE INVENTION

The aim of the present invention is to remedy the above-mentioned drawbacks as well as others also by providing a method for producing metal decorations conforming to the curvature of the parts to be decorated.

The aim of the present invention is to also provide such a method that is simple and inexpensive to implement.

To this end, the aim of the invention is a method for producing at least one metal decoration on a substrate made of insulating material having a curved surface comprising the steps of:
  a) providing the substrate and depositing thereon a photosensitive resin layer;
  b) irradiating the resin layer through a mask defining the contour of the desired decorations;
  c) dissolving the non-irradiated areas of the photosensitive resin layer in order to show in places the substrate at the location of the decorations;
  d) depositing a first adhesion layer and a second electrically conductive layer via a vapour deposition;
  e) galvanically depositing a layer of a metal or of a metal alloy from said conductive face in order to form a layer reaching at least the upper surface of the photosensitive resin;
  f) performing a step of surfacing and polishing in order to remove the surplus of the galvanically deposited layer;
  g) eliminating the remaining resin layer by plasma etching;
  h) eliminating the first and second layers by a wet etching.

This method therefore makes it possible to produce finished parts made of ceramic having a curved surface with metal decorations in relief adapting perfectly to the surface.

In accordance with other advantageous variants of the invention:
  said first adhesion layer is of the Ti, Ta, Cr or Th type;
  said second electrically conductive layer is of the Au, Pt, Ag, Cr, Pd, TiN, CrN, ZrN, Ni type;
  the first adhesion layer has a thickness between 30 nm and 80 nm;
  the second conductive layer has a thickness between 30 nm and 80 nm;
  according to one variant of the method, during step g), a first metal is deposited at the height of the mould, and before step i), the method includes a step h') of depositing a second metal covering the first metal deposited;
  the substrate made of insulating material, is a non-electrically conductive substrate made of ceramic, sapphire, mother-of-pearl, glass, quartz, diamond, mineral material (granite, marble, etc.), polymers, composites or enamel.

Finally, the invention relates to a curved dial made of insulating material having metal decorations, intended to be fixed on to a watch case, and obtained according to a method according to the invention, the decorations being indexes, appliques and/or a logo.

It is therefore understood that the method of the invention finds a particularly advantageous application for the production of decorative parts for timepieces.

SUMMARY DESCRIPTION OF THE DRAWINGS

Other features and advantages of the present invention will become clearly apparent from the following description of one embodiment of a method according to the invention, said example being given for purely illustrative and non-limiting purposes only, in connection with the drawing appended wherein:

FIGS. 1a to 1f illustrate the method steps of one embodiment of the invention in view of the production of a dial provided with appliques.

DETAILED DESCRIPTION OF PREFERRED EMBODIMENTS

The substrate 1 used in step a) of the method according to the invention is, for example, formed by a substrate made of ceramic, sapphire, enamel or other, and having a curved surface. During the first step a) illustrated in FIG. 1 it is deposited a resin layer The photosensitive resin 5 used in step a) of the method according to the invention is preferably a resin of octofunctional epoxy-based negative resin available from Microchem under the reference SU-8 and of a photoinitiator chosen from triarylsulfonium salts such as same described in U.S. Pat. No. 4,058,401. Said resin is likely to be photopolymerised when exposed to a UV radiation. It will be noted that a solvent that has proven suitable for said resin is gamma-Butyrolactone (GBL).

Alternatively, a Novolac type phenol-formaldehyde-based resin in presence of a DNQ (DiazoNaphtoQuinone) photoinitiator may also be used.

The resin 5 is deposited on the substrate 1 by any suitable means, by spin coating, whirl coating, or also by spraying up to the desired thickness. Typically the resin thickness is between 1 µm and 500 µm, and more preferably between 20 µm and 300 µm. According to the desired thickness and the deposition technique used the resin 5 will be deposited in one or more times.

The resin 5 is then heated between 80 and 95° C. for a duration depending on the thickness deposited in order to evacuate the solvent. Said heating dries and hardens the resin.

Figure 1B:
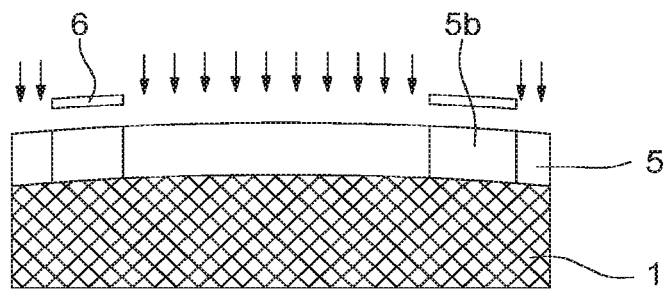

The subsequent step b) illustrated in FIG. 1b consists in irradiating the resin layer 5 by means of a UV radiation through a mask 6 defining the contour of the desired decorations and thus of the photopolymerised areas 5a and of the non-photopolymerised areas 5b. Typically, said UV irradiation is from 200 to 1,000 mJ·cm-2, measured at a typical wavelength of 365 nm depends on the thickness of the layer and on the type of resin selected.

If applicable, a step of annealing the resin layer 5 may be necessary in order to complete the photopolymerisation induced by the UV irradiation. Said annealing step is carried out preferably between 90° C. and 95° C. for 15 to 30 minutes, or even longer according to the thickness. The photopolymerised areas 5a become insensitive to a vast majority of solvents. However, the non-photopolymerised areas may subsequently be dissolved by a solvent.

Figure 1C:
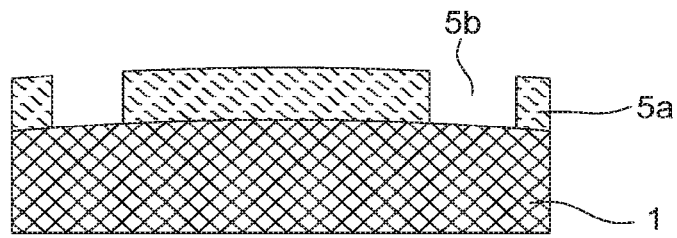
Figure 1D:
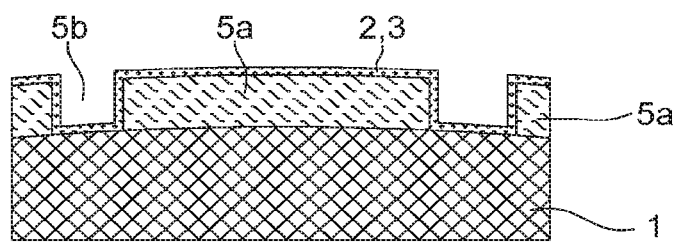

The subsequent step c) illustrated in FIG. 1c consists in developing the non-photopolymerised areas 5b of the photosensitive resin layer in order to show in places the substrate 1. Said operation is performed by dissolving the non-photopolymerised areas 5b by means of a suitable solvent, for example chosen from GBL (gamma-Butyrolactone) and PGMEA (propylene glycol methyl ether acetate). A mould made of photopolymerised photosensitive resin 5a having the contours of a decoration is thus produced.

During step d) of the method, it is deposited, for example, by physical vapour deposition (PVD) method, a first adhesion layer 2 and a second conductive layer 3, that is to say a layer capable of starting a metal deposition galvanically. Typically, the adhesion layer 2 is of the Ti, Ta, Cr or Th type, and has a thickness between 30 nm and 80 nm, and the conductive layer 3 is of the Au, Pt, Ag, Cr, Pd, TiN, CrN, ZrN, Ni type (FIG. 1a) and also has a thickness between 30 nm and 80 nm. The first and second adhesion layers may be deposited by any other means known by the person skilled in the art.

Alternatively, the substrate may be produced in stainless steel or in another metal capable of starting an electroforming reaction. In this case, the first and second layers are no longer necessary. In the case of a substrate made of stainless steel, said latter will be degreased before use, and the rear will be protected with varnish or a resin in order to prevent the galvanic deposition on said rear face.

Figure 1E:
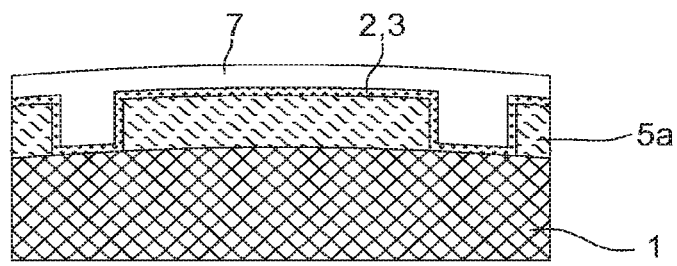
Figure 1F:
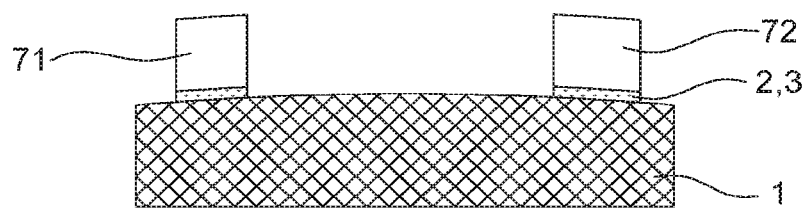

The subsequent step e) illustrated in FIG. 1e consists in galvanically depositing in the moulds a layer of a metal from said conductive layer 3 until a layer 7 is formed, preferably reaching at least the height of the moulds, the thickness of the metal layer being between 1 µm and 500 µm, and more preferably between 20 µm and 300 µm. Metal in this context is of course understood to include the metal alloys. Typically, the metal will be chosen from the group comprising nickel, copper, gold or silver, and, as alloy, gold-copper, nickel-cobalt, nickel-iron, nickel-phosphorus or nickel-tungsten.

The electroforming conditions, in particular the composition of the baths, the geometry of the system, the current voltages and densities, are chosen for each metal or alloy to be electrodeposited according to the techniques well known in the art of electroforming (see for example Di Bari G. A. "Electroforming" Electroplating Engineering Handbook 4th Edition written by L. J. Durney, published by Van Nostrand Reinhold Company Inc., N.Y. USA 1984).

During step f) of the method, a surfacing and/or a polishing of the layer galvanically deposited during the previous step is performed in order to remove the surplus and obtain a clean surface.

The subsequent step g) consists in eliminating the resin layer 5a, the first adhesion layer 2 and the second conductive layer 3 by means of a plasma etching and/or a wet etching, which makes it possible to remove said layers without damaging the electrodeposited blocks 71, 72.

At the end of this step g), a substrate 1 with electrodeposited blocks 71, 72 forming a decoration on the substrate 1 is obtained, the first and second layers 2, 3 also being present in places, on the substrate after the elimination of the remaining resin.

At the end of this step, the parts obtained may be cleaned, and optionally reworked on a machine tool in order to perform machining operations or an aesthetic finish. At this stage, the parts may be used directly or indeed subjected to various decorative and/or functional treatments, typically physical or chemical depositions.

According to one alternative of the invention, in step e) it is galvanically deposited a layer of a first metal such as for example nickel from said conductive layer in order to form a layer of a height less than or equal to the height of the resin.

The subsequent step h) remains the same, and an additional step h') is carried out during which it is galvanically deposited a layer of another metal or alloy, for example precious such as gold, on top of the layer of the first metal. Finally, in step g) the adhesion layer 4 and the conductive 3 and adhesion layers 2 are eliminated by at least one wet etching.

Such an alternative is less expensive and easier to implement, the development of nickel being easier to control and less expensive than a precious metal such as gold.

The method of the invention finds a particularly advantageous application for the production of decorative parts for timepieces, and more particularly for curved dials made of non-conductive material, having metal decorations on the surface thereof. The decorations may be indexes, appliques, logos or brand names for example. Thanks to this method, it can be provided a curved dial made of non-conductive material of any type of metal decoration adapting perfectly to the curvature of the surface of the curved dial, with a very precise positioning, and in a multi-part method therefore economically interesting.

The invention claimed is:

1. A method of producing at least one metal decoration on a substrate made of insulating material having a curved upper surface, the method comprising:
    a) providing the substrate and depositing a photosensitive resin layer directly on the curved upper surface of the insulating material of the substrate;
    b) irradiating the photosensitive resin layer through a mask defining a contour of desired decorations as well as of photopolymerised areas and of non-photopolymerised areas;
    c) dissolving non-irradiated areas of the photosensitive resin layer in order to show in places the substrate at the location of the decorations;
    d) depositing a first adhesion layer and a second electrically conductive layer via a vapour deposition on the substrate and the photopolymerised areas;
    e) galvanically depositing a layer of a first metal or of a metal alloy from said second electrically conductive layer in order to form at least one block substantially reaching the upper surface of the photosensitive resin layer;
    f) performing surfacing and polishing in order to remove surplus of the galvanically deposited layer;
    g) eliminating a remaining resin layer by plasma etching; and
    h) eliminating the first and second layers by a wet etching.

2. The method according to claim 1, wherein said first adhesion layer is Ti, Ta, Cr or Th.

3. The method according to claim 1, wherein said second electrically conductive layer is chosen from: Au, Pt, Ag, Cr, Pd, TiN, CrN, ZrN or Ni.

4. The method according to claim 1, wherein the first adhesion layer has a thickness between 30 nm and 80 nm.

5. The method according to claim 1, wherein the second electrically conductive layer has a thickness between 30 nm and 80 nm.

6. The method according to claim 1, wherein:
    during step e), depositing a second metal or metal alloy covering the layer of the first metal or of the metal alloy.

7. The method according to claim 1, wherein the substrate made of insulating material, is a substrate made of ceramic, sapphire, mother-of-pearl, glass, quartz, diamond, mineral material, polymers, composites, or enamel.

8. The method according to claim 1, wherein the substrate is a dial of a watch case.

9. The method according to claim 8, wherein, at the conclusion of step h), electrodeposited blocks are fixed to the watch case via the first adhesion layer and the second electrically conductive layer to form a decoration on the watch case.

10. The method according to claim 1, wherein, at the conclusion of step g), all of the photosensitive resin layer, including the remaining resin layer, is removed from the substrate.

* * * * *